United States Patent
Chang et al.

(10) Patent No.: US 10,412,845 B2
(45) Date of Patent: Sep. 10, 2019

(54) HEAD MOUNTED DISPLAY

(71) Applicant: HTC Corporation, Taoyuan (TW)

(72) Inventors: Li-Hsun Chang, Taoyuan (TW); Kuan-Ying Ou, Taoyuan (TW)

(73) Assignee: HTC Corporation, Taoyuan (TW)

( * ) Notice: Subject to any disclaimer, the term of this patent is extended or adjusted under 35 U.S.C. 154(b) by 0 days.

(21) Appl. No.: 15/935,064

(22) Filed: Mar. 26, 2018

(65) Prior Publication Data

US 2019/0141847 A1 May 9, 2019

Related U.S. Application Data (60) Provisional application No. 62/581,782, filed on Nov. 6, 2017.

(51) Int. Cl.
| | |
|---|---|
| *H05K 7/02* | (2006.01) |
| *H05K 7/04* | (2006.01) |
| *H05K 5/02* | (2006.01) |
| *H05K 5/00* | (2006.01) |
| *G02B 27/00* | (2006.01) |

(52) U.S. Cl.
CPC ........... *H05K 5/0217* (2013.01); *G02B 27/00* (2013.01); *H05K 5/0017* (2013.01); *H05K 5/0086* (2013.01)

(58) Field of Classification Search
USPC ........................................................ 361/807
See application file for complete search history.

(56) References Cited

U.S. PATENT DOCUMENTS

| | | | |
|---|---|---|---|
| 5,774,096 A | * | 6/1998 | Usuki ..................... G02B 7/12 340/980 |
| 9,179,729 B2 | | 11/2015 | Cotterman et al. |

(Continued)

FOREIGN PATENT DOCUMENTS

| | | |
|---|---|---|
| CN | 101937132 | 1/2011 |
| CN | 106255916 | 12/2016 |

(Continued)

OTHER PUBLICATIONS

"Office Action of Taiwan Counterpart Application," dated Sep. 20, 2018, pp. 1-8.

*Primary Examiner* — Hung S. Bui
(74) *Attorney, Agent, or Firm* — JCIPRNET (57) ABSTRACT

A head mounted display including a main strap, a display part, an adjusting mechanism, a forehead pad, a plurality of holders and a lace is provided. The main strap surrounds a user's head. The display part is connected to the main strap and corresponds to the user's eyes. The adjusting mechanism is disposed on the main strap. The forehead pad corresponds to the user's frontal bone. The holders are disposed on the main strap and the forehead pad. A path of the lace in sequence passes through a retractable portion, a portion of the main strap near a first side of the display part, a first side of the forehead pad, a fixed portion of the lace, a second side of the forehead pad and a portion of the main strap near a second side of the display part. The adjusting mechanism connects the retractable portion and is adapted to adjust a magnitude of tension of the lace at the retractable portion. The lace is fixed at the main strap and the forehead pad by the holders.

16 Claims, 6 Drawing Sheets

(56) References Cited

U.S. PATENT DOCUMENTS

| | | | | |
|---|---|---|---|---|
| 2007/0266481 A1* | 11/2007 | Alexander | ............ | A42B 3/127 |
| | | | | 2/414 |
| 2010/0327028 A1* | 12/2010 | Nakabayashi | ......... | A42B 1/247 |
| | | | | 224/162 |
| 2016/0370590 A1 | 12/2016 | Fujishiro | | |
| 2018/0299681 A1* | 10/2018 | Eastwood | ................. | A45F 5/00 |
| 2018/0325203 A1* | 11/2018 | Cotterman | ............ | A42B 3/064 |

FOREIGN PATENT DOCUMENTS

| | | |
|---|---|---|
| CN | 206020823 | 3/2017 |
| TW | 201730710 | 9/2017 |

\* cited by examiner

HEAD MOUNTED DISPLAY

CROSS-REFERENCE TO RELATED APPLICATION

This application claims the priority benefit of U.S. provisional application Ser. No. 62/581,782, filed on Nov. 6, 2017. The entirety of the above-mentioned patent application is hereby incorporated by reference herein and made a part of this specification.

BACKGROUND OF THE INVENTION

Field of the Invention

The disclosure relates to a head mounted display, and more particularly, to a head mounted display capable of adapting the wearing pressure automatically.

Description of Related Art

Virtual reality (VR) system has become a really popular technology in the market. After putting on the head mounted display (HMD) with head straps or other accessories for holding the device on the head, the user can watch three-dimensional images with the display part located in front of the eyes and is granted a more vivid and immersive feeling. To ensure that the head mounted display can be worn on the user's head fittingly, Velcro or gear structures are generally used to tighten up the head mounted display and make the head mounted display closely fit the contour of the head. However, since the head shape differs person by person, some users may feel uncomfortable when wearing the head mounted display because the head mounted display does not fit the contour of their head.

SUMMARY OF THE INVENTION

The disclosure relates to a head mounted display capable of automatically adapting the distribution of the wearing pressure when the user is tightening up the display, so as to create a more comfortable user experience.

A head mounted display of the disclosure includes a main strap, a display part, an adjusting mechanism, a forehead pad, a plurality of holders and a lace. The main strap is adapted to surround a user's head. The display part is connected to the main strap and corresponds to the user's eyes. The adjusting mechanism is disposed on the main strap. The forehead pad corresponds to a frontal bone of the user. The holders are disposed on the main strap and the forehead pad. A path of the lace in sequence passes a retractable portion of the lace, a portion of the main strap near a first side of the display part, a first side of the forehead pad, a fixed portion of the lace, a second side of the forehead pad and a portion of the main strap near a second side of the display part. The adjusting mechanism connects the retractable portion and is adapted to adjust a magnitude of tension of the lace at the retractable portion, and the lace is fixed at the main strap and the forehead pad by the holders. The first side of the display part and the second side of the display part are respectively located on two opposite sides of the display part, and the first side of the forehead pad and the second side of the forehead pad are respectively located on two opposite sides of the forehead pad.

Another head mounted display of the disclosure includes a main strap, a display part, an adjusting mechanism, a rear pad, a plurality of holders and a lace. The main strap is adapted to surround a user's head. The display part is connected to the main strap and corresponds to the user's eyes. The adjusting mechanism is disposed on the main strap. The rear pad corresponds to the user's occipital bone. The holders are disposed on the main strap and the rear pad. A path of the lace in sequence passes a retractable portion of the lace, a portion of the main strap near a first side of the display part, a first side of the rear pad, a fixed portion of the lace, a second side of the rear pad and a portion of the main strap near a second side of the display part. The adjusting mechanism connects the retractable portion and is adapted to adjust a magnitude of tension of the lace at the retractable portion, and the lace is fixed at the main strap and the rear pad by the holders. The first side of the display part and the second side of the display part are respectively located on two opposite sides of the display part, and the first side of the rear pad and the second side of the rear pad are respectively located on two opposite sides of the rear pad.

Based on the above, in the head mounted display of the disclosure, the degree of tightening and loosening when the head mounted display is being worn is adjusted by the lace. Besides, because the retractable portion of the lace is nearer to the display part and is rather away from the forehead pad or the rear pad, when the magnitude of tension of the lace is being adjusted at the retractable portion, the tension near the forehead pad or the rear pad is smaller than the tension near the display part, so as to avoid overly pressurize the user's frontal bone or occipital bone and to thereby create a more comfortable user experience.

To make the above features and advantages of the disclosure more comprehensible, several embodiments accompanied with drawings are described in detail as follows.

DESCRIPTION OF THE EMBODIMENTS

It is to be understood that both the foregoing and other detailed descriptions, features and advantages are intended to be described more comprehensively by providing an embodiment accompanied with figures hereinafter. In this regard, directional terminology, such as "top," "bottom," "left," "right," "front," and "back," is used with reference to the orientation of the figure(s) being described. Therefore, the directional wording is used to illustrate rather than limit the disclosure. Moreover, the same or similar reference numerals represent the same or similar elements in the following embodiments.

Figure 1:
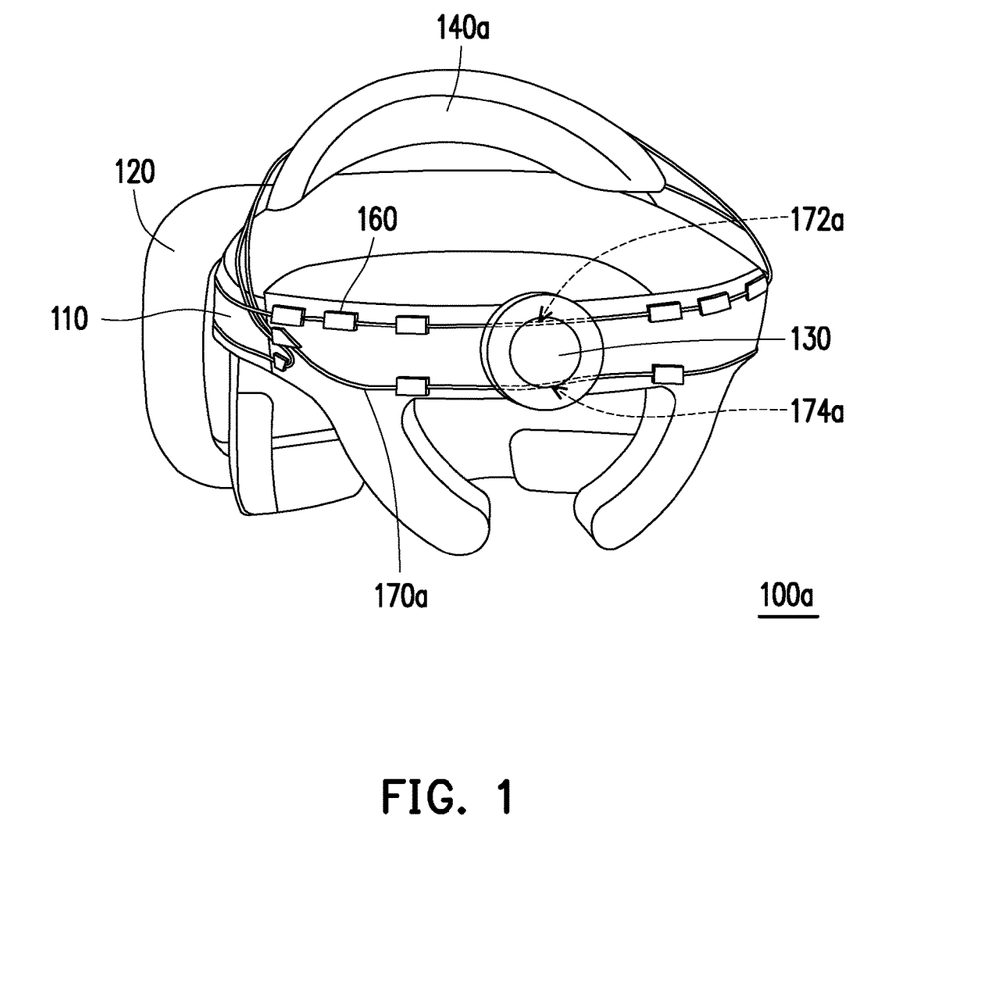
FIG. 1 is a schematic three-dimensional view of a head mounted display according to an embodiment of the invention.
Figure 2:
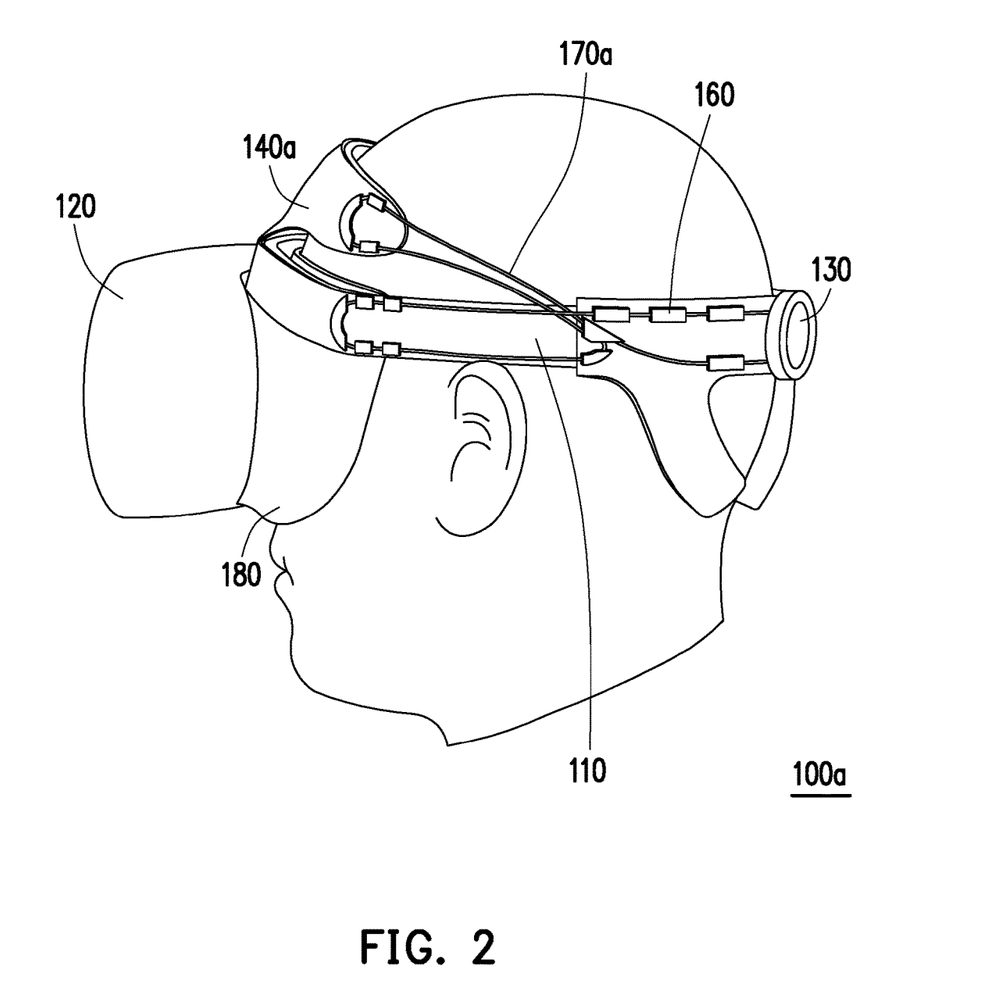
FIG. 2 is a schematic view showing the head mounted display of FIG. 1 worn on a user's head.
Figure 3:
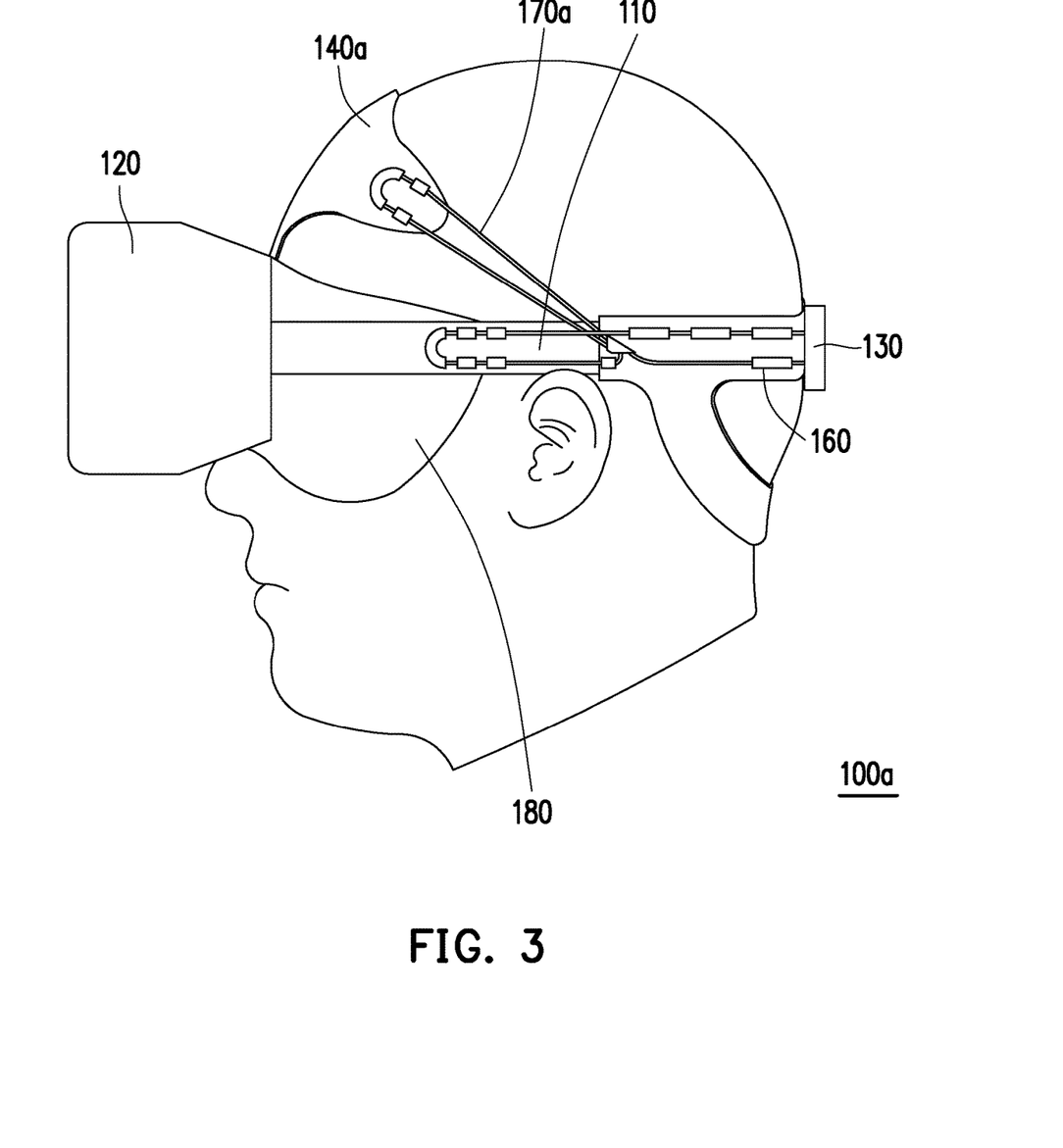
FIG. 3 is a schematic view showing the head mounted display of FIG. 1 worn on a user's head from a side perspective.

FIG. 1 is a schematic three-dimensional view of a head mounted display according to an embodiment of the invention. FIG. 2 is a schematic view showing the head mounted display of FIG. 1 worn on a user's head. FIG. 3 is a schematic view showing the head mounted display of FIG. 1 worn on a user's head from a side perspective. Referring to FIG. 1 to FIG. 3, a head mounted display 100a according to the embodiment includes a main strap 110, a display part 120, an adjusting mechanism 130, a forehead pad 140a, a plurality of holders 160 and a lace 170a. The main strap 110 is adapted to surround a user's head. The display part 120 is connected to the main strap 110. The adjusting mechanism 130 is disposed on the main strap 110. The plurality of holders 160 are disposed on the main strap 110 and the forehead pad 140a. The lace 170a is fixed at the main strap 110 and the forehead pad 140a by the plurality of holders 160.

Referring to FIG. 2 and FIG. 3, the display part 120 corresponds to the user's eyes, wherein the display part is, for example, a liquid-crystal display (LCD), or an organic light-emitting diode (OLED) display. Besides, the display part 120 may also include a motion sensor, other electronic components and optical components, and so on. The motion sensor may be an accelerometer (for example, a gravity sensor) or any sensor that is able to sense the linear movement, the direction thereof and the rotational movement (for example, the angular velocity thereof and the angle of rotation) of the head mounted display 100a.

The forehead pad 140a corresponds to the user's frontal bone, serving as a portion supporting the front of the head when the user is wearing the head mounted display 100a. In this embodiment, the main strap 110 is disposed horizontally, and the head mounted display 100a further includes two vice straps 180. The vice straps 180 respectively correspond to the user's two zygomatic bones and are respectively connect the main strap 110 to a first side of the display part 120 and a second side of the display part 120, allowing the lower edge of the display part 120 fit more steadily on the user's cheeks. Besides, the main strap 110, the display part 120, the forehead pad 140a and the vice straps 180 may be disposed a soft material, such as rubber or sponge, on the inner portion attaching to the user's face, such that the user may feel more comfortable when wearing the head mounted display 100a.

In this embodiment, the head mounted display 100a adjusts the wearing pressure by adjusting the tension of a lace 170a. A path of the lace 170a in sequence passes a retractable portion 172a of the lace 170a, a portion near the first side of the display part 120 of the main strap 110, a first side of the forehead pad 140a, a fixed portion 174a of the lace 170a, a second side of the forehead pad 140a and a portion near the second side of the display part 120 of the main strap 110. Therefore, referring to FIG. 2 and FIG. 3, the lace 170a connects a portion of the vice straps 180 on the left and right side of the main strap 110 respectively, forms is an enclosed O-shape at a portion of the forehead pad 140a where a fixed member is disposed, and then winds back to the adjusting mechanism 130. The first side of the display part 120 and the second side of the display part 120 are respectively located on two opposite sides of the display part 120. The first side of the forehead pad 140a and the second side of the forehead pad 140a are respectively located on two opposite sides of the forehead pad 140a. For example, the first side of the display part 120 and the first side of the forehead pad 140a both correspond to the left half of the user's head, and the second side of the display part 120 and the second side of the forehead pad 140a both correspond to the right half of the user's head, or the condition the other way round may also applies.

Specifically, each fixed member 160 of the embodiment may be a through hole allowing the lace 170a pass through, a hook or other member that is able to restrain the movement of the lace. The adjusting mechanism 130 connects the retractable portion 172a and is adapted to adjust the magnitude of tension of the lace 170a at the retractable portion 172a. The lace 170a passes the through holes on the fixed members 160 in sequence along the path and finally tightens at a fixed portion 174a located at a place overlapping the adjusting mechanism 130.

Furthermore, in the head mounted display 100a of the embodiment, the display part 120, adjusting mechanism 130, the forehead pad 140a and the vice straps 180 are laterally symmetric with respect to the middle line (not illustrated in the drawings) of the face on the head. Besides, the main strap 110 passes a side of the user's ear near the parietal bone. Through the disposition, the head mounted display 100a may be easier to wear and more visually pleasing when being worn.

The method of wearing the head mounted display 100a of the embodiment and how to adjust the degree of tightening the head mounted display 100a when wearing the same are to be elaborated hereinafter.

First, the user aligns the display part 120 to the user's eyes and puts on the main strap 110 over the user's whole head, such that the head mounted display 100a is roughly fixed on the head. Then, the user may rotate the adjusting mechanism 130 to adjust the length of the lace 170a, thereby shortening the lace 170a to tighten up the head mounted display 100a. In this embodiment, the adjusting mechanism 130 includes, for example, a dial and a gear set, the dial and the gear set may tighten up or loosen the lace 170a at the retractable portion 172a by rotating. However, the adjusting mechanism 130 is not limited thereto. In other embodiments of the disclosure, the adjusting mechanism 130 may also be in other forms, as long as the adjusting mechanism 130 is connected to the lace 170a and fixes the lace 170a at a particular length after adjusting. The lace 170a is constituted by an elastomer. Therefore, when the adjusting mechanism 130 shortens the length of the lace 170a, the tension of the lace 170a increases. Also, because the retractable portion 172a connected to the adjusting mechanism 130 is nearer to the lace 170a disposed on the main strap 110, the lace 170a starts tightening from two sides of the main strap 110 near the display part 120 and jointly tightens up the main strap 110 near the display part 120, the forehead pad 140a and the lace 170a near the fixed portion 174a, such that the main strap 110 near the display part 120, the forehead pad 140a and the main strap 110 at the back side of the head closely fits the contour of the head, until the whole lace 170a reaches a force balance.

On the other hand, the through hole on each of the holders 160 is set in a size similar to a cross section of the lace 170a. As such, when the lace 170a starts tightening by the adjusting mechanism 130, the holders 160 of the main strap 110 near the display part 120, which are passed through by the lace 170a at first, rub with the lace 170a and produce a frictional force that offsets the tension of the lace 170a. Then, the holders 160 on the forehead pad 140a, which are passed through by the lace 170a, also rub with the lace 170a and produce a frictional force that offsets the tension of the lace 170a, and so forth. When the whole lace 170a finally reaches force balance, the tension of the portion of lace 170a on the main strap 110 near the display part 120 is greater than the tension of the portion of lace 170a on the forehead pad 140a, the tension of the portion of lace 170a on the forehead pad 140a is further greater than the tension of the portion of lace 170a near the fixed portion 174a, and correspondingly affects the pressure applied by the main strap 110 and the forehead pad 140a on the head. In other words, with the lace 170a in sequence passing a retractable portion 172a, the portion of the main strap 110 near the first side of the display part 120, the first side of the forehead pad 140a, the fixed portion 174a, the second side of the forehead pad 140a and the portion of the main strap 110 near the second side of the display part 120. When the user rotates the adjusting mechanism 130, the display part 120, the forehead pad 140a and the main strap 110 at the back side of the head may closely fit the contour of the head. Moreover, the wearing pressure of the display part 120, the forehead pad 140a and the main strap 110 at the back side of the head have effects of descending in sequence, such that the head mounted display 100a modifies the degree of tightening in different areas according to the head shape of the user and thereby brings a more comfortable user experience.

In the head mounted display 100a of the embodiment, since the display part 120, the adjusting mechanism 130, the forehead pad 140a and the vice straps 180 are laterally symmetric with respect to the middle line of the face on the head, when the user rotates the adjusting mechanism 130 to tighten up the lace 170a at the retractable portion 172a, the location of the head mounted display 100a relative to the whole head does not change but simply tightens and fits more closely to the contour of the head, such that the user feels more stable and comfortable when wearing the head mounted display 100a. However, each component of the head mounted display 100a may also be in a form not laterally symmetric with respect to the middle line of the face on the head, the disclosure is not limited thereto. In addition, for convenience of illustration, the lace 170a and the holders 160 of the embodiment are presented in a form being exposed externally, but the disclosure is not limited thereto. The lace 170a and the holders 160 may also be additionally covered by a housing to be more visually pleasing.

Another embodiment of the head mounted display is to be elaborated below.

Figure 4:
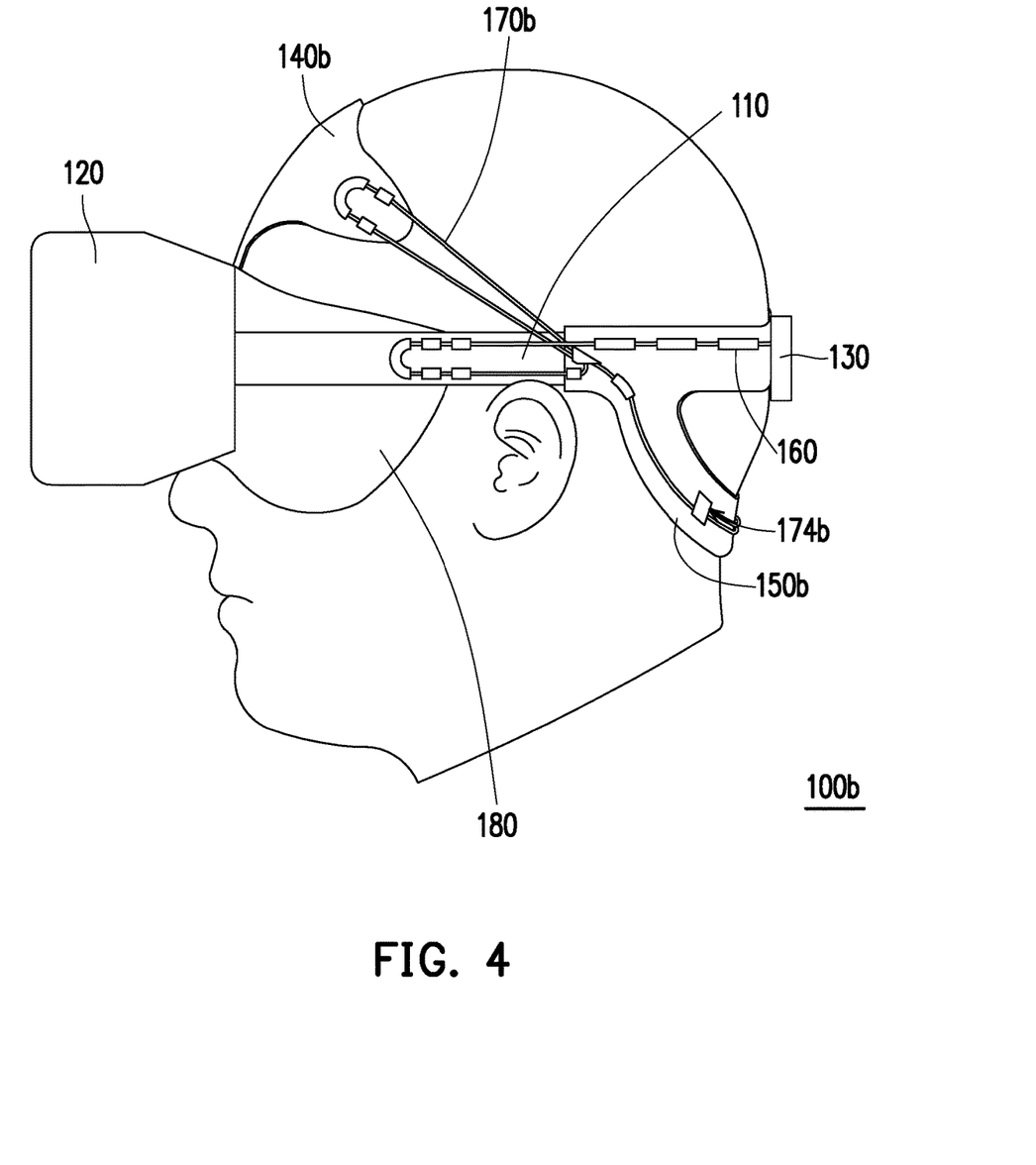
FIG. 4 is a schematic view showing a head mounted display according to another embodiment of the invention worn on a user's head from a side perspective.

FIG. 4 is a schematic view showing a head mounted display according to another embodiment of the invention worn on a user's head from a side perspective. Referring to both FIG. 3 and FIG. 4, the head mounted display 100b of the embodiment is similar to the head mounted display 100a of FIG. 2, and the difference among the two lies in: the head mounted display 100b of FIG. 4 further includes a rear pad 150b corresponding to the user's occipital bone, wherein a plurality of holders 160 are disposed on the main strap 110, a forehead pad 140b and the rear pad 150b. Besides, in the embodiment, the fixed portion of the lace 170b is not located at a place overlapping the adjusting mechanism 130 but on the holders 160 on the left and right sides of the rear pad 150b. Therefore, as shown in FIG. 4, the lace 140b connects a portion of the vice straps 180 on the left and right sides of the main strap 110 respectively, forms an enclosed O-shape at a portion of the forehead pad 140b where a fixed member is disposed, then extends to a side of the rear pad 150b, winds to the back of the head and ends at the other side of the rear pad 150b.

When putting on the head mounted display 100b of the embodiment, the user only has to align the display part 120 to the user's eyes and puts on the main strap 110 over the user's whole head, such that the head mounted display 100b is roughly fixed on the head. Then, the user may rotate the adjusting mechanism 130 to adjust the length of the lace 170b, thereby shortening the lace 170b to tighten up the head mounted display 100b. In this embodiment, the lace 170b is also constituted by an elastomer. Therefore, when the adjusting mechanism 130 shortens the length of the lace 170b, the tension of the lace 170b increases. Also, because the retractable portion connected to the adjusting mechanism 130 is nearer to the lace 170b disposed on the main strap 110, the lace 170b starts tightening from two sides of the main strap 110 near the display part 120 and jointly tightens up the main strap 110 near the display part 120, the forehead pad 140b and the lace 170b near the rear pad 150b, such that the main strap 110 near the display part 120, the forehead pad 140b and the rear pad 150b closely fit the contour of the head, until the whole lace 170b reaches a force balance.

On the other hand, the through hole on each of the holders 160 is set in a size similar to a cross section of the lace 170b. As such, when the lace 170b starts tightening by the adjusting mechanism 130, the holders 160 of the main strap 110 near the display part 120, which are passed through by the lace 170b at first, rub with the lace 170b and produce a frictional force that offsets the tension of the lace 170b. Then, the holders 160 on the forehead pad 140b, which are passed through by the lace 170b, also rub with the lace 170b and produce a frictional force that offsets the tension of the lace 170b, and so forth. When finally the whole lace 170b reaches a force balance, the tension of the portion of lace 170b on the main strap 110 near the display part 120 is greater than the tension of the portion of lace 170b on the forehead pad 140b, the tension of the portion of lace 170b on the forehead pad 140b is further greater than the tension of the portion of lace 170b on the rear pad 150b, and correspondingly affects the pressure applied by the main strap 110, the forehead pad 140a and the rear pad 150b on the head. In other words, with the lace 170b in sequence passing the retractable portion, the portion of the main strap 110 near the first side of the display part 120, the first side of the forehead pad 140b, the first side of the rear pad 150b, the second side of the rear pad 150b, the second side of the forehead pad 140b and the portion of the main strap 110 near the second side of the display part 120, and with the fixed portions being disposed on the holders 160 on the left and right sides of the rear pad 150b, the display part 120, the forehead pad 140b and the rear pad 150b may all closely fit the contour of the head when the user rotates the adjusting mechanism 130, and the wearing pressure of the display part 120, the forehead pad 140b and the rear pad 150b have effects of descending in sequence. As such, the head mounted display 100b modifies the degree of tightening in different areas according to the head shape of the user and thereby brings a more comfortable user experience.

Herein, the first side of the display part 120 and the second side of the display part 120 are respectively located on two opposite sides of the display part 120. The first side of the forehead pad 140b and the second side of the forehead pad 140b are respectively located on two opposite sides of the forehead pad 140b. The first side of the rear pad 150b and the second side of the rear pad 150b are respectively located on two opposite sides of the rear pad 150b. For example, the first side of the display part 120, the first side of the rear pad 150b and the first side of the forehead pad 140b all correspond to the left half of the user's head, and the second side of the display part 120, the second side of the rear pad 150b and the second side of the forehead pad 140b all correspond to the right half of the user's head, or the condition the other way round may also applies.

Figure 5:
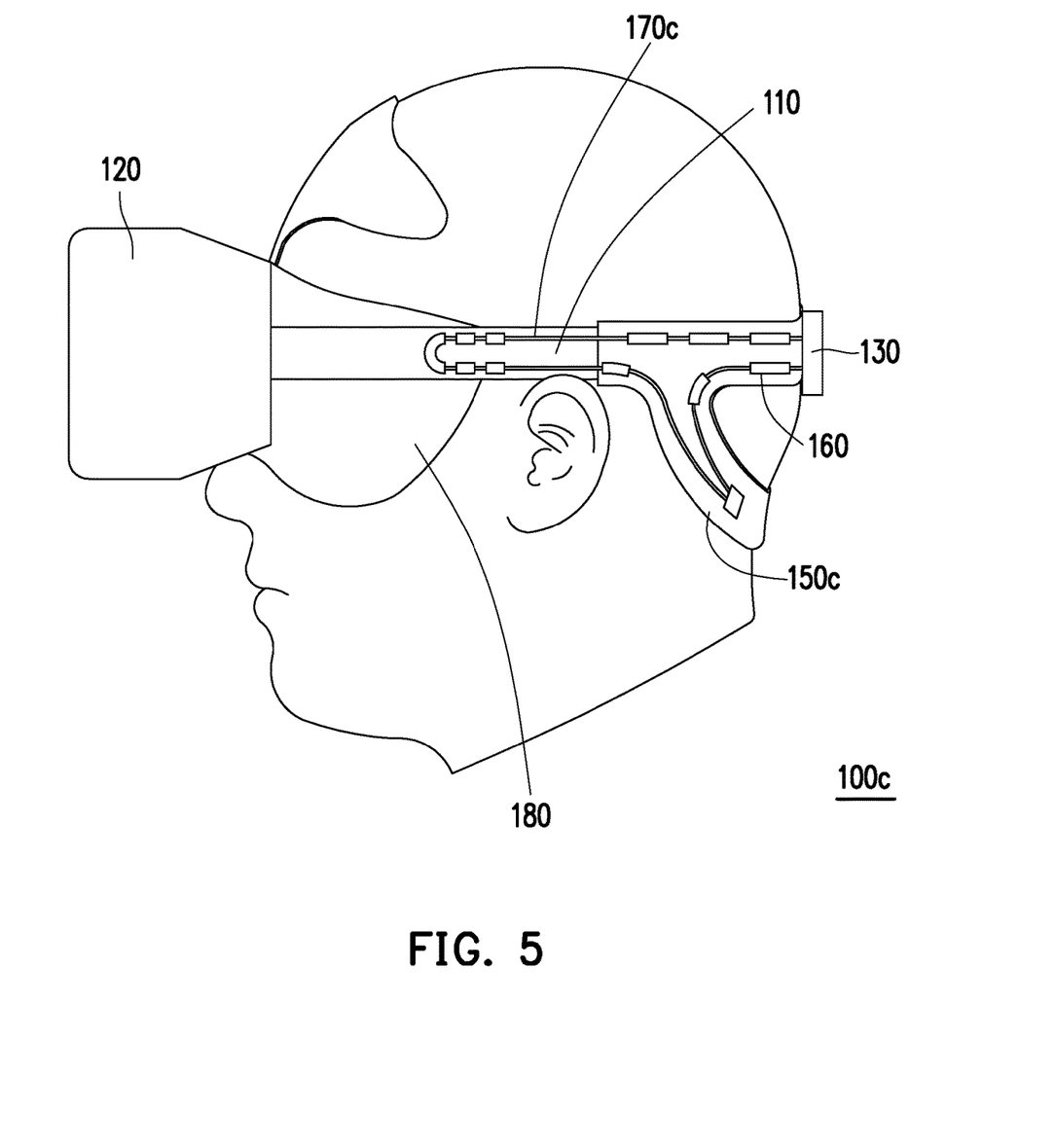
FIG. 5 is a schematic view showing another head mounted display according to an embodiment of the invention worn on a user's head from a side perspective.

FIG. 5 is a schematic view showing another head mounted display according to an embodiment of the invention worn on a user's head from a side perspective. Referring to FIG. 5, a head mounted display 100c according to the embodiment includes a main strap 110, a display part 120, an adjusting mechanism 130, a rear pad 150c, a plurality of holders 160 and a lace 170c. The main strap 110 is adapted to surround a user's head. The display part 120 is connected to the main strap 110. The adjusting mechanism 130 is disposed on the main strap 110. The plurality of holders 160 are disposed on the main strap 110 and the rear pad 150c. The lace 170c is fixed at the main strap 110 and the rear pad 150c by the plurality of holders 160.

The display part 120 of the head mounted display 100c corresponds to the user's eyes, and the function and type of the display part 120 of the head mounted display 100c is similar to the display part 120 of the head mounted display 100a, so is not reiterated herein. The rear pad 150c corresponds to the user's occipital bone, serving as a portion supporting the back of the head when the user is wearing the head mounted display 100c. In this embodiment, the main strap 110 is disposed horizontally, and the head mounted display 100c further includes two vice straps 180. The vice straps 180 respectively correspond to the user's two zygomatic bones and are respectively connect the main strap 110 to a first side of the display part 120 and a second side of the display part 120, allowing the lower edge of the display part 120 fit more steadily on the user's cheeks. Besides, the main strap 110, the display part 120, the rear pad 150c and the vice straps 180 may be disposed a soft material, such as rubber or sponge, on the inner portion attaching to the user's face, such that the user may feel more comfortable when wearing the head mounted display 100c.

In this embodiment, the head mounted display 100c adjusts the wearing pressure by adjusting the tension of a lace 170c. A path of the lace 170c in sequence passes a retractable portion of the lace 170c, a portion of the main strap 110 near the first side of the display part 120, a first side of the rear pad 150c, a fixed portion of the lace 170c, a second side of the rear pad 150c and a portion of the main strap 110 near the second side of the display part 120. Therefore, referring to FIG. 5, The lace 170c forms a T-shape respectively at the left and right sides of the main strap 110 and the adjusting mechanism 130 where the holders 160 are disposed and the portion of the rear pad 150c where the holders 160 are disposed, and then winds back to the adjusting mechanism 130. The two T-shapes are connected to each other.

Herein, the first side of the display part 120 and the second side of the display part 120 are respectively located on two opposite sides of the display part 120. The first side of the rear pad 150c and the second side of the rear pad 150c are respectively located on two opposite sides of the rear pad 150c. For example, the first side of the display part 120 and the first side of the rear pad 150c both correspond to the left half of the user's head, and the second side of the display part 120 and the second side of the rear pad 150c both correspond to the right half of the user's head, or the condition the other way round may also applies.

Similarly, in this embodiment, each holder 160 has a through hole allowing the lace 170c pass through. The adjusting mechanism 130 connects the retractable portion and is adapted to adjust the magnitude of tension of the lace 170c at the retractable portion. The lace 170c passes the through holes on the holders 160 in sequence along the path and finally tightens at a fixed portion located at a place overlapping the adjusting mechanism 130.

Furthermore, in the head mounted display 100c of the embodiment, the left and right portions of the rear pad 150c are not separate from each other as shown in FIG. 1 to FIG. 3 but are connected to each other and form an O-shape. Furthermore, the display part 120, the adjusting mechanism 130, the rear pad 150c and the vice straps 180 are laterally symmetric with respect to the middle line (not illustrated in the drawings) of the face on the head. Besides, the main strap 110 passes a side of the user's ear near the parietal bone. Through the disposition, the head mounted display 100c may be easier to wear and more visually pleasing when being worn.

When putting on the head mounted display 100c of the embodiment, the user only has to align the display part 120 to the user's eyes and puts on the main strap 110 over the user's whole head, such that the head mounted display 100c is roughly fixed on the head. Then, the user may rotate the adjusting mechanism 130 to adjust the length of the lace 170c, thereby shortening the lace 170c to tighten up the head mounted display 100c. In this embodiment, the adjusting mechanism 130 is a dial that may tighten up or loosen the lace 170c at the retractable portion by rotating. However, the adjusting mechanism 130 is not limited thereto. In other embodiments of the invention, the adjusting mechanism 130 may also be in other forms, as long as the adjusting mechanism 130 is connected to the lace 170c and fixes the lace 170c at a particular length after adjusting. The lace 170c is constituted by an elastomer. Therefore, when the adjusting mechanism 130 shortens the length of the lace 170c, the tension of the lace 170c increases accordingly. Also, because the retractable portion connected to the adjusting mechanism 130 is nearer to the lace 170c disposed on the main strap 110, the lace 170c starts tightening from two sides of the main strap 110 near the display part 120 and jointly tightens up the main strap 110 near the display part 120, the rear pad 150c and the lace 170c near the fixed portion, such that the main strap 110 near the two sides of the display part 120, the rear pad 150c and the main strap 110 at the back side of the head closely fit the contour of the head, until the whole lace 170c reaches a force balance.

On the other hand, the through hole on each of the holders 160 is set in a size similar to a cross section of the lace 170c. As such, when the lace 170c starts tightening by the adjusting mechanism 130, the holders 160 of the main strap 110 near the display part 120, which are passed through by the lace 170c at first, rub with the lace 170c and produce a frictional force that offsets the tension of the lace 170c. Then, the holders 160 on the rear pad 150c, which are passed through by the lace 170c, also rub with the lace 170c and produce a frictional force that offsets the tension of the lace 170c, and so forth. When finally the whole lace 170c reaches a force balance, the tension of the portion of the lace 170c on the main strap 110 near the display part 120 is greater than the tension of the portion of the lace 170c on the rear pad 150c, the tension of the portion of the lace 170c on the rear pad 150c is further greater than the tension of the portion of the lace 170c near the main strap 110 at the back side of the head, and correspondingly affects the pressure applied by the main strap 110 and the rear pad 150c on the head. In other words, with the lace 170c in sequence passing the retractable portion, the portion of the main strap 110 near the first side of the display part 120, the first side of the rear pad 150c, the fixed portion, the second side of the rear pad 150c and the portion of the main strap 110 near the second side of the display part 120, the display part 120, the rear pad 150c and the main strap 110 at the back side of the head may closely fit the contour of the head when the user rotates the adjusting mechanism 130, and the wearing pressure of the display part 120, the rear pad 150c and the main strap 110 at the back side of the head have effects of descending in sequence. As such, the head mounted display 100c modifies the degree of tightening in different areas according to the head shape of the user and thereby brings a more comfortable user experience.

In the head mounted display 100c of the embodiment, since the display part 120, the adjusting mechanism 130, the rear pad 150c and the vice straps 180 are laterally symmetric with respect to the middle line of the face on the head, when the user rotates the adjusting mechanism 130 to tighten up the lace 170c at the retractable portion, the location of the head mounted display 100c relative to the whole head does not change but simply tightens and fits more closely to the contour of the head, such that the user feels more stable and comfortable when wearing the head mounted display 100c. However, each component of the head mounted display 100c may also be in a form not laterally symmetric with respect to the middle line of the face on the head, the disclosure is not limited thereto.

Another embodiment of the head mounted display is to be elaborated below.

Figure 6:
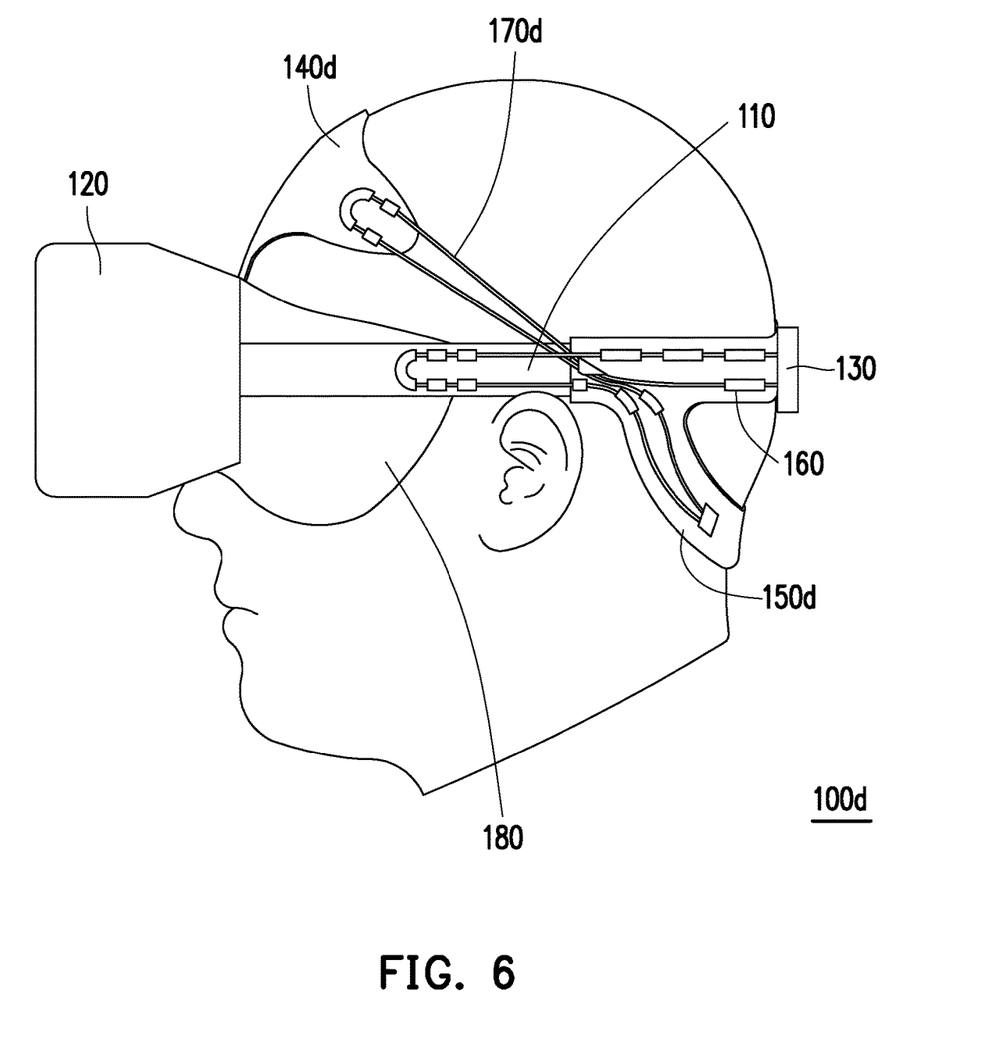
FIG. 6 is a schematic view showing a head mounted display according to another embodiment of the invention worn on a user's head from a side perspective.

FIG. 6 is a schematic view showing a head mounted display according to another embodiment of the invention worn on a user's head from a side perspective. Referring to both FIG. 5 and FIG. 6, a head mounted display 100d of the embodiment is similar to the head mounted display 100c of FIG. 5, and the difference among the two lies in: the head mounted display 100d of FIG. 6 further includes a forehead pad 140d corresponding to the user's frontal bone, wherein a plurality of holders 160 are disposed on the main strap 110, a rear pad 150d and the forehead pad 140d. Besides, in this embodiment, a path of a lace 170d in sequence passes a retractable portion of the lace 170d, a portion of the main strap 110 near the first side of the display part 120, a first side of the rear pad 150d, a first side of the forehead pad 140d, a fixed portion, a second side of the forehead pad 140d, a second side of the rear pad 150d and a portion of the main strap 110 near a second side of the display part 120. As such, as shown in FIG. 6, the lace 170d forms a T-shape respectively at the left and right sides of the main strap 110 and the adjusting mechanism 130 where the holders 160 are disposed and the portion of the rear pad 150d where the holders 160 are disposed, forms an O-shape at a portion of the forehead pad 140d where a fixed member is disposed, and then winds back to the adjusting mechanism 130. The two T-shapes are connected to each other.

When putting on the head mounted display 100d of the embodiment, the user only has to align the display part 120 to the user's eyes and puts on the main strap 110 over the user's whole head, such that the head mounted display 100d is roughly fixed on the head. Then, the user may rotate the adjusting mechanism 130 to adjust the length of the lace 170d, thereby shortening the lace 170d to tighten up the head mounted display 100d. In this embodiment, the lace 170d is also constituted by an elastomer. Therefore, when the adjusting mechanism 130 shortens the length of the lace 170d, the tension of the lace 170d increases accordingly. Also, because the retractable portion connected to the adjusting mechanism 130 is nearer to the lace 170d disposed on the main strap 110, the lace 170d starts tightening from two sides of the main strap 110 near the display part 120 and jointly tightens up the main strap 110 near the display part 120, the rear pad 150d and the lace 170d on the forehead pad 140d, such that the main strap 110 near the two sides of the display part 120, the rear pad 150d and the main strap 110 at the back side of the head closely fit the contour of the head, until the whole lace 170d reaches a force balance.

On the other hand, the through hole on each of the holders 160 is set in a size similar to a cross section of the lace 170. As such, when the lace 170 starts tightening by the adjusting mechanism 130, the holders 160 of the main strap 110 near the display part 120, which are passed through by the lace 170 at first, rub with the lace 170d and produce a frictional force that offsets the tension of the lace 170d. Then, the holders 160 on the rear pad 150d, which are passed through by the lace 170d, also rub with the lace 170d and produce a frictional force that offsets the tension of the lace 170d, and so forth. When finally the whole lace 170d reaches a force balance, the tension of the portion of the lace 170d on the main strap 110 near the display part 120 is greater than the tension of the portion of the lace 170d on the rear pad 150d, the tension of the portion of lace 170d on the rear pad 150d is further greater than the tension of the portion of lace 170d on the forehead pad 140d, and correspondingly affects the pressure applied by the main strap 110, the rear pad 150d and the forehead pad 140d on the head. In other words, with the lace 170d in sequence passing the retractable portion, the portion of the main strap 110 near the first side of the display part 120, the first side of the rear pad 150d, the first side of the forehead pad 140d, the fixed portion, the second side of the forehead pad 140d, the second side of the rear pad 150d, and the portion of the main strap 110 near the second side of the display part 120, the display part 120, the rear pad 150d and the forehead pad 140d may all closely fit the contour of the head when the user rotates the adjusting mechanism 130, and the wearing pressure of the display part 120, the rear pad 150d and the forehead pad 140d have effects of descending in sequence. As such, the head mounted display 100d modifies the degree of tightening in different areas according to the head shape of the user and thereby brings a more comfortable user experience.

In sum of the foregoing, in the design of the head mounted display of the present disclosure, with the retractable portion of the lace connected to the adjusting mechanism and with the adjusting mechanism adjusting the length of the lace at the retractable portion, the user may adjust the wearing pressure of the head mounted display by adjusting the length of the lace. Besides, with the lace in sequence passing the retractable portion, the portion of the main strap near the first side of the display part, the first side of the forehead pad, the fixed portion, the second side of the forehead pad and the portion of the main strap near the second side of the display part, or with the lace in sequence passing the retractable portion, the portion of the main strap near the first side of the display part, the first side of the rear pad, the fixed portion, the second side of the rear pad and the portion of the main strap near the second side of the display part, the user may further modify the degree of tightening in different areas according to the need and thereby creates a more comfortable user experience.

Although the disclosure has been described with reference to the above embodiments, the disclosure is not limited to the above embodiments. It is apparent to one of ordinary skill in the art that modifications and variations to the described embodiments may be made without departing from the spirit and scope of the disclosure. Accordingly, the scope of the disclosure will be defined by the attached claims.

What is claimed is:
1. A head mounted display, comprising:
a main strap, adapted to surround a user's head;
a display part, connected to the main strap and corresponding to the user's eyes;
an adjusting mechanism, disposed on the main strap;
a forehead pad, corresponding to the user's frontal bone;
a rear pad, corresponding to the user's occipital bone;

a plurality of holders, disposed on the main strap and the forehead pad; and a lace, comprising a retractable portion and a fixed portion, wherein the retractable portion of the lace adjustably connects with the adjust mechanism, and the lace elastically connects a portion of the main strap near a first side of the display part, a first side of the forehead pad, a first side of the rear pad, a second side of the rear pad, a second side of the forehead pad and a portion of the main strap near a second side of the display part in sequence, wherein the lace is held at the main strap, the first and second sides of the forehead pad by the holders respectively disposed thereon, the adjusting mechanism is adapted to adjust a magnitude of tension of the lace at the retractable portion, the first side of the display part and the second side of the display part are respectively located on two opposite sides of the display part, and the first side of the forehead pad and the second side of the forehead pad are respectively located on two opposite sides of the forehead pad.

2. The head mounted display according to claim 1, wherein the plurality of holders are disposed on the main strap, the forehead pad and the rear pad, and the fixed portion is located at the rear pad.

3. The head mounted display according to claim 1, wherein a path of the lace has a first junction and a second junction, the path of the lace in sequence passes the retractable portion of the lace, the portion of the main strap near the first side of the display part, the first junction, the first side of the forehead pad, the fixed portion of the lace, the second side of the forehead pad, the second junction and the portion of the main strap near the second side of the display part, the first junction is located between the adjusting mechanism and the first side of the display part, and the second junction is located between the adjusting mechanism and the second side of the display part.

4. The head mounted display according to claim 1, wherein the fixed portion of the lace is located at a place overlapping the adjusting mechanism.

5. The head mounted display according to claim 1, further comprising:
two vice straps, respectively corresponding to the user's two zygomatic bones, the vice straps respectively connect the main strap to the first side of the display part and the second side of the display part.

6. The head mounted display according to claim 1, wherein the main strap is disposed horizontally.

7. The head mounted display according to claim 1, wherein the lace is constituted by an elastomer.

8. The head mounted display according to claim 1, wherein the main strap passes a side of the user's ear near the user's parietal bone.

9. A head mounted display, comprising:
a main strap, adapted to surround a user's head;
a display part, connected to the main strap and corresponding to the user's eyes;
an adjusting mechanism, disposed on the main strap;
a rear pad, corresponding to the user's occipital bone;
a plurality of holders, disposed on the main strap and the rear pad; and a lace, comprising a retractable portion and a fixed portion, wherein the retractable portion of the lace adjustably connects with the adjust mechanism, and the lace elastically connects a portion of the main strap near a first side of the display part, a first side of the rear pad, a second side of the rear pad and a portion of the main strap near a second side of the display part in sequence, wherein the lace is held at the main strap, the first and second sides of the rear pad by the holders respectively disposed thereon, the adjusting mechanism is adapted to adjust a magnitude of tension of the lace at the retractable portion, the first side of the display part and the second side of the display part are respectively located on two opposite sides of the display part, and the first side of the rear pad and the second side of the rear pad are respectively located on two opposite sides of the rear pad.

10. The head mounted display according to claim 9, further comprising: a forehead pad, corresponding to the user's frontal bone, wherein the plurality of holders are disposed on the main strap, the rear pad and the forehead pad, a path of the lace in sequence passes the retractable portion of the lace, the portion of the main strap near the first side of the display part, the first side of the rear pad, a first side of the forehead pad, the fixed portion of the lace, a second side of the forehead pad, the second side of the rear pad and the portion of the main strap near the second side of the display part, and the lace is fixed at the forehead pad by the plurality of holders.

11. The head mounted display according to claim 10, wherein the path of the lace has a first junction and a second junction, the path of the lace in sequence passes the retractable portion of the lace, the portion of the main strap near the first side of the display part, the first junction, the first side of the rear pad, the first side of the forehead pad, the first junction, the fixed portion of the lace, the second junction, the second side of the forehead pad, the second side of the rear pad, the second junction and the portion of the main strap near the second side of the display part, the first junction is located between the adjusting mechanism and the first side of the display part, and the second junction is located between the adjusting mechanism and the second side of the display part.

12. The head mounted display according to claim 9, wherein the fixed portion of the lace is located at a place overlapping the adjusting mechanism.

13. The head mounted display according to claim 9, further comprising:
two vice straps, respectively corresponding to the user's two zygomatic bones, the vice straps respectively connect the main strap to the first side of the display part and the second side of the display part.

14. The head mounted display according to claim 9, wherein the main strap is disposed horizontally.

15. The head mounted display according to claim 9, wherein the lace is constituted by an elastomer.

16. The head mounted display according to claim 9, wherein the main strap passes a side of the user's ear near the user's parietal bone.

* * * * *